US010563095B2

(12) United States Patent
Shinba

(10) Patent No.: US 10,563,095 B2
(45) Date of Patent: Feb. 18, 2020

(54) ADHESIVE COMPOSITION SHEET, METHOD OF PRODUCING SAME, AND SEMICONDUCTOR DEVICE

(71) Applicant: TORAY INDUSTRIES, INC., Tokyo (JP)

(72) Inventor: Yoichi Shinba, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 44 days.

(21) Appl. No.: 15/551,663

(22) PCT Filed: Mar. 9, 2016

(86) PCT No.: PCT/JP2016/057400

§ 371 (c)(1),
(2) Date: Aug. 17, 2017

(87) PCT Pub. No.: WO2016/158268

PCT Pub. Date: Oct. 6, 2016

(65) Prior Publication Data

US 2018/0016470 A1 Jan. 18, 2018

(30) Foreign Application Priority Data

Mar. 27, 2015 (JP) .................. 2015-066030

(51) Int. Cl.
*H01L 21/00* (2006.01)
*C09J 7/00* (2018.01)
(Continued)

(52) U.S. Cl.
CPC . *C09J 7/00* (2013.01); *C09J 5/00* (2013.01); *C09J 7/10* (2018.01); *C09J 11/04* (2013.01);
(Continued)

(58) Field of Classification Search
CPC ... H01L 21/52; H01L 23/36; C09J 7/00; C09J 7/10; C09J 7/381; C09J 5/00; C09J 11/04; C09J 123/14; C09J 153/00; C09J 201/00
(Continued)

(56) References Cited

U.S. PATENT DOCUMENTS

| 6,517,744 B1 | 2/2003 | Hara et al. | |
| 2011/0287240 A1* | 11/2011 | Ikishima | B32B 7/02 428/215 |
| 2013/0302602 A1* | 11/2013 | Takeda | C09J 123/14 428/354 |

FOREIGN PATENT DOCUMENTS

| EP | 2647685 A1 | 10/2013 |
| EP | 2979864 A1 | 2/2016 |

(Continued)

OTHER PUBLICATIONS

International Search Report for PCT/JP2016/057400 (PCT/ISA/210 dated Jun. 14, 2016.
(Continued)

*Primary Examiner* — Brook Kebede
(74) *Attorney, Agent, or Firm* — Birch, Stewart, Kolasch & Birch, LLP

(57) ABSTRACT

Provided is an adhesive composition sheet containing an organic compound and inorganic particles, the adhesive composition sheet including a structure obtained by stacking a layer A that contains at least an organic compound and a layer B that contains an organic compound and inorganic particles, the layer A having a content rate of the organic compound larger than the content rate of the organic compound in the layer B, and the layer A and/or the layer B containing anisotropically shaped inorganic particles. The (Continued)

present invention provides an adhesive composition sheet excellent in thermal conductivity and insulating properties after cured.

10 Claims, 1 Drawing Sheet

(51) Int. Cl.
*C09J 11/04* (2006.01)
*H01L 23/36* (2006.01)
*H01L 21/52* (2006.01)
*C09J 201/00* (2006.01)
*C09J 5/00* (2006.01)
*C09J 7/10* (2018.01)
*C09J 163/00* (2006.01)

(52) U.S. Cl.
CPC ............ *C09J 201/00* (2013.01); *H01L 21/52* (2013.01); *H01L 23/36* (2013.01); *C09J 163/00* (2013.01); *C09J 2201/12* (2013.01); *C09J 2201/36* (2013.01); *C09J 2203/326* (2013.01); *C09J 2205/102* (2013.01); *C09J 2463/00* (2013.01); *C09J 2479/08* (2013.01)

(58) Field of Classification Search
USPC .................................. 428/215, 354; 438/118
See application file for complete search history.

(56) References Cited

FOREIGN PATENT DOCUMENTS

| | | | |
|---|---|---|---|
| JP | 2001-315244 | A | 11/2001 |
| JP | 2007-246861 | A | 9/2007 |
| JP | 2008-7590 | A | 1/2008 |
| JP | 2009-164093 | A | 7/2009 |
| JP | 2010-235842 | A | 10/2010 |
| JP | 2011-54611 | A | 3/2011 |
| JP | 2011-70930 | A | 4/2011 |
| JP | 2011-230472 | A | 11/2011 |
| JP | 2012-213899 | A | 11/2012 |
| JP | 2013-119595 | A | 6/2013 |
| JP | 2013-159098 | A | 8/2013 |
| WO | WO 2014/157520 | A1 | 10/2014 |

OTHER PUBLICATIONS

Written Opinion of the International Searching Authority for PCT/JP2016/057400 (PCT/ISA/237) dated Jun. 14, 2016.
Extended European Search Report, dated Jul. 19, 2018, for European Application No. 16772152.1.
Singaporean Written Opinion and Search Report, dated Jun. 22, 2018, for Singaporean Application No. 11201707365Y.

* cited by examiner

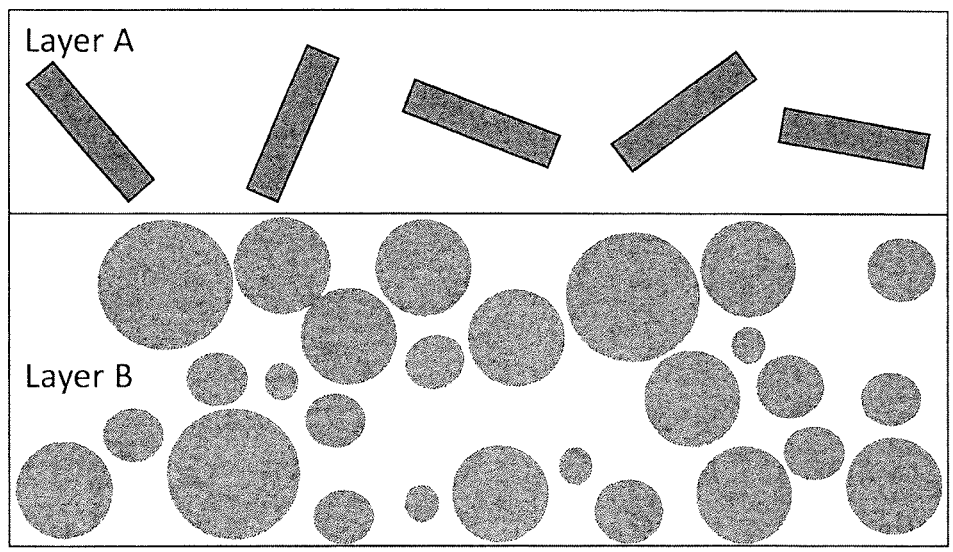

ADHESIVE COMPOSITION SHEET, METHOD OF PRODUCING SAME, AND SEMICONDUCTOR DEVICE

TECHNICAL FIELD

The present invention relates to an adhesive composition sheet that can be used for adhering an electronic component such as a semiconductor chip to a heat dissipator such as a wiring substrate, a heat spreader, or a heat sink, or adhering electronic components to each other.

BACKGROUND ART

Recently, electronic devices have been required of saving of power consumption, and a demand for a semiconductor chip capable of efficiently converting power, namely a power semiconductor has been increasing. The power semiconductor is mainly used for power control of, for example, a hybrid vehicle and an electric vehicle and for home electric appliances such as an air conditioner that is large in power consumption. Particularly, the power semiconductor used in, for example, a hybrid vehicle and an electric vehicle is large in ampacity and large in amount of heat generation during use. Therefore, a cooling system high in heat dissipation has been required to prevent malfunction caused by a temperature rise. The heat generated in the power semiconductor is transferred to a heat sink via a heat spreader and cooled. Therefore, an adhesive composition that adheres the heat spreader to the heat sink has been required of high thermal conductivity.

Further, along with an increase in arithmetic processing capability of a semiconductor chip used in, for example, a personal computer and a mobile phone, an amount of heat generation is increasing, causing to be pointed out, for example, a problem that an arithmetic circuit of the semiconductor chip malfunctions due to a temperature rise and a problem that a portion where heat is accumulated is locally expanded and distorted to cause a rupture of a metal junction. Particularly, in a structure in which semiconductor chips are stacked, the heat generated from the semiconductor chips are likely to be accumulated in the semiconductor chips. Therefore, in order to efficiently dissipate the heat from the semiconductor chips, an adhesive composition that adheres a semiconductor chip to a wiring substrate or that adheres semiconductor chips to each other has been required of high thermal conductivity. Further, the adhesive composition is also required of excellent insulating properties as well as high thermal conductivity.

As a material used for the high thermal conductive adhesive composition, there is proposed an adhesive composition whose coefficient of thermal conductivity is increased by highly filling a thermosetting resin such as an epoxy resin with two types or more of high thermal conductive inorganic particles having different particle sizes, namely alumina particles (for example, see Patent Document 1). There is also proposed an adhesive composition including a polyimide resin whose thermal conductivity, insulating properties, and thermal resistance have been improved by adding inorganic particles high in heat dissipation (for example, see Patent Document 2). Further, there is proposed an adhesive composition whose heat dissipation is increased by adding to a resin high thermal conductive inorganic particles, namely aluminum nitride (for example, see Patent Document 3).

PRIOR ART DOCUMENTS

Patent Documents

Patent Document 1: Japanese Patent Laid-open Publication No. 2007-246861
Patent Document 2: Japanese Patent Laid-open Publication No. 2012-213899
Patent Document 3: Japanese Patent Laid-open Publication No. 2008-7590

SUMMARY OF THE INVENTION

Problem to be Solved by the Invention

The coefficient of thermal conductivity of an adhesive composition obtained by the techniques described above, however, cannot be said to be sufficiently high, and an adhesive composition having a higher coefficient of thermal conductivity has been required. An object of the present invention is to provide an adhesive composition sheet excellent in film thickness-wise thermal conductivity after cured.

Solutions to the Problem

The present invention is an adhesive composition sheet containing an organic compound and inorganic particles, the adhesive composition sheet including a structure in which at least a layer A that contains an organic compound and a layer B that contains an organic compound and inorganic particles are laminated, the layer A having a content rate of the organic compound larger than the content rate of the organic compound in the layer B, and the layer A and/or the layer B containing anisotropically shaped thermal conductive inorganic particles.

The present invention includes, as regards the adhesive composition sheet, an adhesive composition sheet having a three-or-more layer structure in which the layer A and the layer B are laminated alternately.

The present invention also includes a semiconductor device including a cured product of the adhesive composition sheet.

The present invention further includes a method of producing a semiconductor device that includes the steps of bonding an electronic component to a heat dissipator or bonding electronic components to each other with an adhesive composition sheet interposed between the electronic component and the heat dissipator or between the electronic components, and curing the adhesive composition sheet, the adhesive composition sheet including a layer A that contains at least an organic compound and a layer B that contains an organic compound and inorganic particles, the layer A having a content rate of the organic compound larger than the content rate of the organic compound in the layer B, and the layer A and/or the layer B containing anisotropically shaped thermal conductive inorganic particles.

Effects of the Invention

According to the present invention, there can be provided an adhesive composition sheet excellent in film thickness-wise thermal conductivity after cured. The adhesive composition sheet of the present invention is used to efficiently conduct the heat generated from a semiconductor chip such as a power semiconductor exteriorly via the adhesive composition sheet excellent in thermal conductivity, suppressing a temperature rise of the semiconductor chip, to provide a semiconductor device that has no malfunction and is high in reliability.

The FIGURE shows an example of the laminate of layers A and B, wherein layer A contains anisotropically shaped thermal conductive inorganic particles and layer B contains spherically shaped thermal conductive inorganic particles.

EMBODIMENTS OF THE INVENTION

An adhesive composition sheet of the present invention is an adhesive composition sheet containing an organic compound and inorganic particles, the adhesive composition sheet including a structure in which at least a layer A that contains an organic compound and a layer B that contains an organic compound and inorganic particles are laminated, the layer A having a content rate of the organic compound larger than the content rate of the organic compound in the layer B, and the layer A and/or the layer B containing anisotropically shaped thermal conductive inorganic particles.

The adhesive composition sheet may be a two-layered sheet in which each one of the layer A and the layer B are laminated and may also be a sheet formed of three or more layers in total in which the layer A and the layer B are laminated alternately. The sheet formed of three or more layers may have a structure in which the layer A are laminated on both sides of the layer B, or a structure in which the layer B are laminated on both sides of the layer A. The adhesive composition sheet may also have multi-layer structure.

The adhesive composition sheet of the present invention exhibits excellent film thickness-wise thermal conductivity when made into a cured product in comparison with a conventional adhesive composition sheet. A reason for this is not clear, but the following reasons can be considered.

In a cured product of the adhesive composition sheet, heat flows fast through the inorganic particles but flows slow through the organic compound. Therefore, the more a route through which heat transfers is taken up by the inorganic particles, the more excellent the thermal conductivity becomes. In adhering objects to be adhered to each other with use of the adhesive composition sheet of the present invention, when heating and/or pressurization are performed with the adhesive composition sheet interposed between the objects to be adhered, the organic compound scatters, in the adhesive composition sheet, from the layer A large in content rate of the organic compound to the layer B small in content rate of the organic compound. In the scattering, anisotropically shaped thermal conductive inorganic particles in the layer A and/or the layer B move along with a flow of the organic compound to be oriented along the sheet's film thickness direction. This phenomenon forms, along the film thickness direction, many routes that go through the inorganic particles and is excellent in thermal conductivity. Therefore, the film thickness-wise thermal conductivity of a cured product of the adhesive composition sheet becomes excellent by curing the adhesive composition sheet of the present invention.

Here, the thermal conductive inorganic particles refer to inorganic particles made from a material having high thermal conductivity, such as a carbon nanotube, boron nitride, aluminum nitride, silicon carbide, and aluminum oxide. As to the coefficient of thermal conductivity at a temperature of 30° C. of these inorganic particles, a carbon nanotube is about 3000 W/m·K, boron nitride is about 40 W/m·K, aluminum nitride is 170 W/m·K, silicon carbide is about 50 W/m·K, and aluminum oxide is about 20 W/m·K. Each of these values is much larger than a coefficient of thermal conductivity of 0.1 to 0.3 W/m·K of general organic compounds. An organic compound can be filled with these inorganic particles to give an adhesive composition sheet excellent in thermal conductivity after cured.

The anisotropically shaped inorganic particles refer to particles whose dimension along its one line is larger than any of the dimensions along its other lines. The anisotropically shaped inorganic particles have a length-wise dimension twice or more, preferably 4 times or more and 500 times or less a dimension in a section perpendicular to the length-wise direction. Here, the length-wise direction means a direction in which the diameter of a particle is maximum. In addition, the dimension in a section perpendicular to the length-wise direction is defined as an average value of the diameters of two circles in the section one of which is the smallest circle among circles encompassing the entire section and the other of which is the largest circle among circles encompassing a part of the section and not encompassing apart other than the section. The anisotropic shape may be any of an elliptical shape, a scale shape, a crushed shape, and a fibrous shape. Fibrous inorganic particles are particularly preferable for their large dimensional ratio between the length-wise direction and a section perpendicular to the length-wise direction.

Examples of the anisotropically shaped inorganic particles include a carbon nanotube, a boron nitride nanotube, scale-shaped boron nitride, an aluminum nitride whisker, a silicon carbide whisker, and an aluminum oxide whisker. Among these, inorganic particles selected from a carbon nanotube and an aluminum nitride whisker are more preferable for their high coefficient of thermal conductivity and their fibrous shape-attributed large dimensional ratio between the length-wise direction and a section perpendicular to the length-wise direction. The inorganic particles may be a hollow tube shape.

In the use of an adhesive composition sheet including anisotropically shaped inorganic particles, when a raw material adhesive composition paste is applied onto a substrate, the inorganic particles in the adhesive composition paste are dragged along with application, so that the inorganic particles are generally likely to be oriented with their large dimension line (hereinafter, referred to as a length-wise direction) parallel to a sheet surface. Therefore, when the anisotropically shaped inorganic particles are contained in an adhesive composition sheet of a conventional technique, a thermal conductive route has been less likely to be formed along the sheet's film thickness direction. In contrast, in the adhesive composition sheet of the present invention, it is considered that the inorganic particles move along the sheet's film thickness direction, along with a flow of the organic compound that scatters from the layer A to the layer B, so that the inorganic particles are oriented with their length-wise direction along the sheet's film thickness direction. Accordingly, it is considered that in the present invention, many thermal conductive routes are formed along the adhesive composition sheet's film thickness direction by using the anisotropically shaped inorganic particles to improve the film thickness-wise thermal conductivity of a cured product of the adhesive composition sheet.

The cured product of the adhesive composition sheet of the present invention exhibits excellent film thickness-wise thermal conductivity as described above, therefore enabling, even when the content of the inorganic particles is decreased, designing of film thickness-wise thermal conductivity equal to the film thickness-wise thermal conductivity of a conventional adhesive composition sheet. A decrease in content of the inorganic particles improves the adhesiveness of the adhesive composition sheet and the toughness, the transparency, and the insulating properties of the cured product of the adhesive composition sheet. The adhesive composition sheet high in transparency is preferable because it enables an alignment mark formed on a semiconductor chip to be easily recognized through the adhesive composition sheet when the adhesive composition sheet is used in, for example, three-dimensional mounting obtained by stacking semiconductor chips.

The anisotropically shaped inorganic particles may be contained in either the layer A or the layer B, or may be contained in both the layers. As described above, the anisotropically shaped inorganic particles move along the sheet's film thickness direction, along with a flow of the organic compound from the layer A to the layer B. In the movement, the anisotropically shaped inorganic particles present in the layer A move a longer distance than the anisotropically shaped inorganic particles present in the layer B to increase the degree of orientation along the sheet's film thickness direction. Accordingly, it is particularly preferable that at least the layer A contain the anisotropically shaped inorganic particles because when the layer A contains the anisotropically shaped inorganic particles, many thermal conductive routes are formed along the adhesive composition sheet's film thickness direction to improve the film thickness-wise thermal conductivity.

Examples of the organic compound used in the layer A and the layer B include an epoxy compound, an imide compound, a urethane compound, and an acrylic compound.

The epoxy compound can be used in either a liquid state or a solid state at room temperature. Specific examples of the epoxy compound include jER (registered trade name) 154, 1002, 1009, 5050, YX4000, YX8800, and YL980 (trade names, manufactured by Mitsubishi Chemical Corporation), EPPN502H and NC-3000 (trade names, manufactured by Nippon Kayaku Co., Ltd.), EPICLON (registered trade name) HP-4032, HP-4700, HP-7200, and HP-7200H (trade names, manufactured by DIC Corporation), ARONIX (registered trade name) M-215 and M315 (trade names, manufactured by Toagosei Co., Ltd.), and Epolite 1500NP and Epolite 4000 (trade names, manufactured by KYOEISHA CHEMICAL CO., LTD.). Further, the use of an epoxy compound having a naphthalene skeleton or an anthracene skeleton as the epoxy compound makes the cured product of the adhesive composition sheet of the present invention forma rigid internal structure to preferably increase the reliability of a semiconductor device produced with use of the cured product. Examples of the epoxy compound having a naphthalene skeleton include EPICLON (registered trade name) HP-4032 and HP-4700 (trade names, manufactured by DIC Corporation). Examples of the epoxy compound having an anthracene skeleton include jER (registered trade name) YX8800 (trade name, manufactured by Mitsubishi Chemical Corporation).

Examples of the imide compound include a polyimide. Examples of the urethane compound include polyurethane. Examples of the acrylic compound include an acrylonitrile-butadiene copolymer (NBR), an acrylonitrile-butadiene-methacrylic acid copolymer, and an acrylonitrile-butadiene-acrylic acid copolymer.

The use of the epoxy compound and a thermoplastic resin in combination is preferable for reduction in stress after curing. Examples of the thermoplastic resin include, in addition to the imide compound, the urethane compound, and the acrylic compound, a phenoxy resin, polyester, a polyamide, polypropylene, and a styrene-butadiene copolymer (SBR).

The organic compound contained in the layer A may be the same or different from the organic compound contained in the layer B.

The layer A preferably has a content rate of the organic compound of 60 vol % or more and 100 vol % or less. The lower limit of the content rate is more preferably 70 vol % or more. The upper limit of the content rate is more preferably 99.8 vol % or less, further preferably 99 vol % or less. With the content rate at 60 vol % or more, the organic compound easily scatters from the layer A to the layer B in the use of the adhesive composition sheet, so that the anisotropically shaped inorganic particles present in the layer A and/or the layer B also easily move along with a flow of the organic compound to be easily oriented along the film thickness direction, preferably increasing the film thickness-wise thermal conductivity of the cured product of the adhesive composition sheet. Further, the adhesiveness between the adhesive composition sheet and an object to be adhered is enhanced to preferably increase the reliability of a semiconductor device. In addition, with the content rate of the organic compound at 99.8 vol % or less, the inorganic particles are sufficiently connected to each other in the use of the adhesive composition sheet to more preferably increase the thermal conductivity of the cured product of the adhesive composition sheet.

Here, a method of obtaining the content rate of the organic compound is as follows. First, the weight fractions of components that constitute the layer A are obtained. For example, when the layer A consists of three components, namely a component A, a component B, and a component C, the weight fractions of the components are defined as Aw, Bw, and Cw, respectively. Next, the specific gravities of the components are obtained. The specific gravities of the components A, B, and C are defined as a, b, and c, respectively. A value obtained by dividing the weight fraction of each component by the specific gravity of the component, namely Aw/a, Bw/b, and Cw/c are volume ratios of the components. In the example described above, when the component A is the organic compound, the component B and the component C are the inorganic particles, the content rate (vol %) of the organic compound can be obtained by the formula $(Aw/a)/((Aw/a)+(Bw/b)+(Cw/c))\times100$. The same applies to the description about the content rate (vol %) below.

The layer B preferably has a content rate of the organic compound of 1 vol % or more and 40 vol % or less. The lower limit of the content rate is more preferably 5 vol % or more, further preferably 10 vol % or more. The upper limit of the content rate is more preferably 30 vol % or less. With the content rate of the organic compound at 1 vol % or more, the strength of the layer B is sufficient to preferably suppress the generation of a crack. Further, the adhesiveness between the adhesive composition sheet and an object to be adhered is enhanced to preferably increase the reliability of a semiconductor device. In addition, with the content rate of the organic compound at 40 vol % or less, the organic compound easily scatters from the layer A to the layer B in the use of the adhesive composition sheet, so that the anisotropically shaped inorganic particles present in the layer A and/or the layer B also easily move along with a flow of the organic compound to be easily oriented along the film thickness direction, preferably increasing the film thickness-wise thermal conductivity of the cured product of the adhesive composition sheet.

The whole adhesive composition sheet including the layer A and the layer B together preferably has content rate of the organic compound of 20 vol % or more and 60 vol % or less. The lower limit of the content rate is more preferably 25 vol % or more. The upper limit of the content rate is more preferably 50 vol % or less. With the content rate at 20 vol % or more, for example, unevenness in film thickness, a pinhole, and a crack are preferably decreased. Further, the adhesiveness between the adhesive composition sheet and an object to be adhered is enhanced to preferably increase the reliability of a semiconductor device including the adhesive composition sheet. In addition, with the content rate at 60 vol % or less, the thermal conductivity of the cured product of the adhesive composition sheet is increased and the coefficient of linear expansion is decreased to preferably increase the reliability of a semiconductor device prepared with use of the cured product. Further, with the content rate at 25 vol % or more and 50 vol % or less, these effects are more preferably further enhanced.

As described above, while the layer A and/or the layer B necessarily contain the anisotropically shaped inorganic particles in the present invention, spherical inorganic particles may also be used in combination. In this case, either one of the layers may contain both the anisotropically shaped inorganic particles and the spherical inorganic particles. Alternatively, either one of the layers may contain the anisotropically shaped inorganic particles and the other layer may contain the spherical inorganic particles. The anisotropically shaped inorganic particles are contained to form many thermal conductive routes along the film thickness direction, increasing the film thickness-wise thermal conductivity of the cured product of the adhesive composition sheet. Further, the spherical inorganic particles are contained to uniformly disperse the inorganic particles in the adhesive composition sheet, enhancing the flowability of the organic compound.

As described above, the anisotropically shaped inorganic particles present in the layer A are more likely to be oriented along the sheet's film thickness direction, and therefore the layer A preferably contains the anisotropically shaped inorganic particles as the inorganic particles. In the use of the anisotropically shaped inorganic particles and the spherical inorganic particles in combination, the ratio of the anisotropically shaped inorganic particles is preferably larger in the layer A. Specifically, the content rate of the anisotropically shaped inorganic particles is preferably 60 vol % or more to the entire amount of the inorganic particles. The content rate of the anisotropically shaped inorganic particles is more preferably 80 vol % or more, further preferably 90 vol % or more. The content rate of the spherical inorganic particles is preferably 40 vol % or less, more preferably 20 vol % or less, further preferably 10 vol % or less to the entire amount of the inorganic particles.

On the other hand, the content rate of the inorganic particles in the layer B is higher than the content in the layer A, and therefore the layer B preferably contains the spherical inorganic particles excellent in dispersibility. In the use of the anisotropically shaped inorganic particles and the spherical inorganic particles in combination, the ratio of the spherical inorganic particles is preferably larger in the layer B. Specifically, the content rate of the spherical inorganic particles is preferably 60 vol % or more to the entire amount of the inorganic particles. More preferably, the content rate of the spherical inorganic particles is more preferably 70 vol % or more, further preferably 80 vol % or more. The content rate of the anisotropically shaped inorganic particles is preferably 40 vol % or less, more preferably 30 vol % or less, further preferably 20 vol % or less to the entire amount of the inorganic particles.

Further, the layer A and/or the layer B may also contain, in addition to the thermal conductive inorganic particles, inorganic particles of, for example, silicon oxide, titanium oxide, magnesium oxide, barium sulfate and glass without inhibiting the effects of the present invention. When a plurality of types of inorganic particles are used, the identification of the inorganic particles can be performed by elemental analysis with an EPMA (Electron Probe Micro Analyzer).

The inorganic particles preferably have a maximum particle size of 5 to 100 μm. The lower limit of the maximum particle size is more preferably 10 μm or more. The upper limit of the maximum particle size is more preferably 50 μm or less. With the inorganic particles having a maximum particle size of 5 μm or more, a thermal conductive route is formed through connection of large particles in the adhesive composition sheet to decrease the number of interfaces among particles in the thermal conductive route in comparison with a case of small particles, preferably increasing the thermal conductivity of the cured product of the adhesive composition sheet. With the inorganic particles having a maximum particle size of 100 μm or less, unevenness in film thickness of the adhesive composition sheet is reduced to enhance the adhesiveness between the adhesive composition sheet and an object to be adhered, preferably increasing the reliability of a semiconductor device.

Whereas the inorganic particles preferably have a maxim particle size of 5 to 100 μm as described above, particles having a small particle size are also contained in addition to the particles having a large particle size for penetration of small particles into a gap generated next to the large particles in contact with each other to increase a thermal conductive route formed of the inorganic particles, preferably improving the thermal conductivity of the cured product of the adhesive composition sheet.

As measurement of the particle size of the inorganic particles, exemplified is a method of directly observing the inorganic particles with an optical microscope. Alternatively, the measurement can be performed by observing a section of the cured product of the adhesive composition sheet that contains the inorganic particles with an optical microscope or a scanning electron microscope. The section of the cured product is preferably cut out by a section preparing apparatus that performs cutting with, for example, an ion beam. For particles having a spherical shape, the diameter of the sphere is defined as the particle size, and for particles having an anisotropic shape, the maximum length is defined as the particle size.

When a surface of the inorganic particles is modified with a compound such as a silane coupling agent, the dispersibility of the inorganic particles is preferably enhanced in the adhesive composition sheet. Here, the phrase a surface is modified with a specific compound indicates that the compound is, in a part of the surface or the whole surface of the particles, bound with an atom on the surface of the particles through, for example, covalent bonding or ion bonding. For example, when the silane coupling agent described below is used, a hydroxy group on the surface of the particles and a silanol group of the silane coupling agent form a covalent bond through dehydration condensation.

Examples of the silane coupling agent include vinyltrimethoxysilane, vinyltriethoxysilane, 3-glycidoxypropyltrimethoxysilane, 3-glycidoxypropyltriethoxysilane, 3-acryloxypropyltrimethoxysilane, 3-acryloxypropyltriethoxysilane, 3-methacryloxypropyltrimethoxysilane, 3-methacryloxypropyltriethoxysilane, N-2(aminoethyl)3-aminopropyltrimethoxysilane, N-2(aminoethyl)3-aminopropyltriethoxysilane, N-phenyl-3-aminopropyltrimethoxysilane, 3-isocyanatopropyltriethoxysilane, and 3-mercaptopropyltrimethoxysilane.

The layer A preferably has a content rate of the inorganic particles of 0 vol % or more and 40 vol % or less. The lower limit of the content rate is more preferably 0.2 vol % or more, further preferably 1 vol % or more. The upper limit of the content rate is more preferably 30 vol % or less. With the content rate of the inorganic particles at 0.2 vol % or more, the inorganic particles are sufficiently connected to each other in the use of the adhesive composition sheet to preferably increase the thermal conductivity of the cured product of the adhesive composition sheet. In addition, with the content rate at 40 vol % or less, the organic compound easily scatters from the layer A to the layer B in the use of the adhesive composition sheet, so that the anisotropically shaped inorganic particles present in the layer A and/or the layer B also easily move along with a flow of the organic compound to be easily oriented along the film thickness direction, preferably increasing the film thickness-wise thermal conductivity of the cured product of the adhesive composition sheet. Further, the adhesiveness between the adhesive composition sheet and an object to be adhered is enhanced to preferably increase the reliability of a semiconductor device.

The layer B preferably has a content rate of the inorganic particles of 60 vol % or more and 99 vol % or less. The lower limit of the content rate is more preferably 70 vol % or more. The upper limit of the content rate is more preferably 95 vol % or less, further preferably 90 vol % or less. With the content rate at 60 vol % or more, the thermal conductivity of the cured product of the adhesive composition sheet is preferably increased. In addition, with the content rate at 99 vol % or less, the strength of the layer B is sufficient to preferably suppress the generation of a crack. Further, the adhesiveness between the adhesive composition sheet and an object to be adhered is enhanced to preferably increase the reliability of a semiconductor device.

The whole adhesive composition sheet including the layer A and the layer B together preferably has a content rate of the inorganic particles of 40 vol % or more and 80 vol % or less. The lower limit of the content rate is more preferably 50 vol % or more. The upper limit of the content rate is more preferably 75 vol % or less. With the content rate at 40 vol % or more, the thermal conductivity of the cured product of the adhesive composition sheet is increased and the coefficient of linear expansion is decreased to preferably increase the reliability of a semiconductor device prepared with use of the cured product. In addition, with the content rate at 80 vol % or less, the aggregation of the inorganic particles is reduced in the adhesive composition sheet to preferably decrease, for example, unevenness in film thickness, a pinhole, and a crack. Further, the adhesiveness between the adhesive composition sheet and an object to be adhered is enhanced to preferably increase the reliability of a semiconductor device including the adhesive composition sheet. With the content rate at 50 vol % or more and 75 vol % or less, these effects are more preferably further enhanced.

The layer A preferably has a thickness of 5 µm or more and 80 µm or less. The lower limit of the thickness is more preferably 10 µm or more, further preferably 20 µm or more. In addition, the upper limit of the thickness is more preferably 60 µm or less, further preferably 40 µm or less. With the layer A having a thickness of 5 µm or more, a sufficient amount of the organic compound scatters from the layer A to the layer B in the use of the adhesive composition sheet, so that the inorganic particles present in the layer B move along with a flow of the organic compound to be easily aligned and oriented along the film thickness direction, preferably increasing the film thickness-wise thermal conductivity of the cured product of the adhesive composition sheet. Further, with the layer A having a thickness of 5 µm or more, the adhesiveness is preferably enhanced between the adhesive composition sheet and an object to be adhered. Thus, a semiconductor device including the cured product of the adhesive composition sheet is increased in reliability. With the layer A having a thickness of 80 µm or less, the inorganic particles are sufficiently connected to each other in the use of the adhesive composition sheet to preferably increase the thermal conductivity of the cured product of the adhesive composition sheet.

The layer B preferably has a thickness of 20 µm or more and 300 µm or less. The lower limit of the thickness is more preferably 40 µm or more, further preferably 60 µm or more. The upper limit of the thickness is more preferably 200 µm or less, further preferably 150 µm or less. With the layer B having a thickness of 20 µm or more, the inorganic particles are sufficiently connected to each other in the use of the adhesive composition sheet to preferably increase the thermal conductivity of the cured product of the adhesive composition sheet. With the layer B having a thickness of 300 µm or less, a sufficient amount of the organic compound scatters from the layer A to the layer B in the use of the adhesive composition sheet, so that the inorganic particles present in the layer B move along with a flow of the organic compound to be easily aligned and oriented along the film thickness direction, preferably increasing the film thickness-wise thermal conductivity of the cured product of the adhesive composition sheet. In addition, with the layer B having a thickness of 300 µm or less, the adhesiveness is preferably enhanced between the adhesive composition sheet and an object to be adhered. Thus, a semiconductor device including the cured product of the adhesive composition sheet is increased in reliability.

The adhesive composition sheet of the present invention including the layer A and the layer B together preferably has a whole thickness of 30 µm or more and 500 µm or less. The lower limit of the thickness is more preferably 50 µm or more, further preferably 80 µm or more. In addition, the upper limit of the thickness is more preferably 350 µm or less, further preferably 250 µm or less. With the thickness at 30 µm or more, for example, unevenness in film thickness and a pinhole of the adhesive composition sheet are decreased to preferably enhance the adhesiveness between the adhesive composition sheet and an object to be adhered. Further, with the thickness at 30 µm or more, the insulating properties of the adhesive composition sheet are enhanced to preferably increase the reliability of a semiconductor device. With the thickness at 500 µm or less, the thermal resistance of the adhesive composition sheet is reduced to suppress a temperature rise of a semiconductor device, preferably increasing the reliability of the semiconductor device.

The adhesive composition sheet of the present invention that has been bonded to an object to be adhered can be cured through, for example, heating or irradiation with ultraviolet light. In this case, in order to accelerate the curing of the organic compound in the layer A and the layer B of the adhesive composition sheet, the layer A and/or the layer B may contain a curing accelerator. Both the layer A and the layer B, or one of the layer A and the layer B may contain a curing accelerator. When both the layer A and the layer B contain a curing accelerator, the curing accelerator of the layer A may be the same or different from the curing accelerator of the layer B.

Examples of the curing accelerator include a microcapsule type curing accelerator, an imidazole curing accelerator, an amine curing accelerator, a phosphine curing accelerator, a phosphonium curing accelerator, a sulfonium curing accelerator, and an iodonium curing accelerator.

Specific examples of the microcapsule type curing accelerator include NOVACURE (registered trade name) HX-3941HP, HX-3922HP, HX-3932HP, and HX-3042HP (trade names, manufactured by Asahi Kasei E-materials Corp.).

Specific examples of the imidazole curing accelerator include CUREZOL (registered trade name) 2PZCNS, C11Z-CNS, 2MZ-A, C11-A, 2E4MZ-A, 2MAOK, 2PHZ, and 2P4MHZ (trade names, manufactured by SHIKOKU CHEMICALS CORPORATION).

Specific examples of the sulfonium curing accelerator include SAN-AID (registered trade name) SI-100, SI-150, SI-180, SI-200, SI-B3, and SI-B4 (trade names, manufactured by SANSHIN CHEMICAL INDUSTRY CO., LTD.).

Further, the adhesive composition sheet may contain other additives such as a surfactant and an ion scavenger without impairing the effects of the present invention.

Next described in detail is an example of a method of producing the adhesive composition sheet of the present invention.

Hereinafter, the method is described with a material for forming the layer A as a layer formation paste A and a material for forming the layer B as a layer formation paste B. Further, the method is described with a sheet prepared using the layer formation paste A as a layer formation sheet A and a sheet prepared using the layer formation paste B as a layer formation sheet B.

First, the pastes for forming the layer A and the layer B (the layer formation paste A and the layer formation paste B) are prepared by mixing predetermined amounts of the organic compound, the inorganic particles and a solvent. In the preparation, for example, a surfactant and an ion scavenger may also be mixed as necessary. For the mixing of the materials, a planetary mixer, a homogenizer, a ball mill, or a bead mill can be used.

As the inorganic particles, a powder may be used that is formed through aggregation of primary particles, or a dispersion liquid of the inorganic particles may be used.

For modifying a surface of the inorganic particles with a compound such as a silane coupling agent, for example, the following steps can be performed. The inorganic particles in a form of a powder formed through aggregation of primary particles are mixed with the solvent, and the aggregated inorganic particles are loosened or pulverized by a dispersing device such as a planetary mixer, a homogenizer, a ball mill, or a bead mill to disperse the inorganic particles in the solvent. Next, the resulting dispersion liquid of the inorganic particles is mixed with a compound such as a silane coupling agent for surface modification and stirred at a temperature of 100° C. or less for several hours to modify the surface of the inorganic particles with the compound. The compound for surface modification may be mixed with the solvent in advance before the dispersion of the inorganic particles to simultaneously perform the dispersion treatment and the surface treatment of the inorganic particles. Further, other compounds such as a dispersant and an antifoaming agent can also be mixed. The dispersion liquid of the inorganic particles that have undergone surface modification may be used as it is to prepare the layer formation pastes, or an inorganic particle powder obtained by removing the solvent from the dispersion liquid with use of, for example, a rotary evaporator may be used to prepare the layer formation pasts.

Next, the layer formation sheet A and the layer formation sheet B are prepared from the layer formation paste A and the layer formation paste B, respectively, that have been prepared as described above.

As a method of preparing the layer formation sheets, there can be exemplified a method of applying the layer formation paste onto a peelable substrate and then removing a volatile component such as the solvent. Specifically, first, the layer formation paste is applied onto the peelable substrate with use of a device such as a bar coater, screen printing, a blade coater, a die coater, or a comma coater. Examples of the peelable substrate include fluororesin films such as a polyethylene terephthalate film, a polyethylene naphthalate film, a polyester film, a polyvinyl chloride film, a polycarbonate film, a polyimide film, and a polytetrafluoroethylene film, a polyphenylene sulfide film, a polypropylene film, and a polyethylene film. The peelable substrate, however, is not limited to these examples. In addition, the peelable substrate may be subjected to a surface treatment with a parting agent such as a silicone parting agent, a long-chain alkyl parting agent, a fluorine parting agent, or an aliphatic amide parting agent. The thickness of the peelable substrate is not particularly limited but is preferably 5 to 75 µm.

As a method of removing a volatile component such as the solvent, there can be exemplified, in addition to heating with an oven or a hot plate, vacuum drying and heating with electromagnetic waves such as infrared rays or microwaves. Here, when the removal of the solvent is insufficient, when, for example, a semiconductor chip, a circuit board, or a heat sink is adhered with the adhesive composition sheet interposed and then the adhesive composition sheet is cured by further high temperature heating, air bubbles are sometimes generated to reduce the adhesion force. On the other hand, when the heating for removing the solvent is excessively performed, curing of the adhesive composition sheet sometimes proceeds to reduce the adhesion force. Drying conditions are preferably a drying temperature of 50 to 150° C. and a drying period of 2 to 30 minutes.

Next, the resulting layer formation sheet A can be bonded to the resulting layer formation sheet B to prepare an adhesive composition sheet. Each one of the sheets can be bonded to each other to give a two-layered adhesive composition sheet. Alternatively, the sheets can be alternately bonded on top of one another to prepare a three- or more-layered adhesive composition sheet.

The bonding of the layer formation sheets can be performed with a bonding machine such as a roll laminator or a vacuum laminator. Alternatively, collective bonding can also be performed with a plurality of layer formation sheets of each of the layer A and the layer B alternately stacked, to prepare an adhesive composition sheet in which the plurality of layer formation sheets are laminated. The collective bonding can be performed with a hot press device. Bonding conditions are preferably a temperature of 50 to 150° C. and a pressure of 0.1 to 10 MPa.

As another aspect, the layer formation paste can be applied to a surface of a layer that has already been formed to laminate a layer. A specific example is that, first, the layer formation paste B is applied onto the peelable substrate and the solvent is removed to form the layer B. Next, the layer formation paste A is applied onto the layer B and the solvent is removed to give a two-layered adhesive composition sheet in which the layer A is laminated on the layer B. Further, such a method can be repeated to prepare a three- or more-layered adhesive composition sheet in which the layer A and the layer B are laminated alternately.

In the method of applying the layer formation paste on a surface of a layer that has already been formed to laminate another layer, the surface of the layer that has already been formed is sometimes eroded by the solvent in the layer formation paste for forming the other layer. Therefore, more preferred is the method of preparing the adhesive composition sheet by bonding the layer formation sheet A to the layer formation sheet B.

The adhesive composition sheet of the present invention can be suitably used for production of a semiconductor device. The semiconductor device referred to in the present invention indicates overall devices that can function by using characteristics of a semiconductor element. The semiconductor device all includes electrooptical devices including a semiconductor element and a substrate connected to the semiconductor element, semiconductor circuit boards, those obtained by stacking a plurality of semiconductor elements, and electronic devices including these components. The semiconductor elements refer to electronic components such as a semiconductor chip, a diode, and a transistor that include a semiconductor.

Specifically, the adhesive composition sheet of the present invention can be suitably used for application of adhering an electronic component such as a semiconductor chip to a heat dissipator such as a wiring substrate, a heat spreader, or a heat sink, or adhering electronic components to each other, to produce a semiconductor device. The heat dissipator refers to a component for dissipating heat, such as a heat sink, in a narrow sense. In the present invention, however, the heat dissipator refers to not only the heat sink but also all members, such as a wiring substrate and a heat spreader, that can transfer the heat generated from an electric component and prevent accumulation of the heat in the electric component.

The adhesive composition sheet of the present invention has excellent film thickness-wise thermal conductivity when made into a cured product. Therefore, an electronic component such as a power semiconductor can be adhered to a heat dissipator with the adhesive composition sheet of the present invention to efficiently conduct the heat generated from the electronic component to the heat dissipator via the cured product of the adhesive composition sheet that is excellent in thermal conductivity, suppressing a temperature rise of the electronic component, to provide a semiconductor device that has no malfunction and is high in reliability. Also in a case of adhering electronic components to each other with the adhesive composition sheet of the present invention, thermal conduction between the electronic components becomes good, preferably allowing the heat to be easily conducted to a heat dissipator eventually.

A semiconductor device of the present invention includes the cured product of the adhesive composition sheet of the present invention. Specifically, there can be exemplified a semiconductor device obtained by adhering an electronic component to a heat dissipator or adhering electronic components to each other with the cured product of the adhesive composition sheet interposed between the electronic component and the heat dissipator or between the electronic components.

Next described in details is an example of a method of producing the semiconductor device of the present invention with use of the adhesive composition sheet of the present invention. Here, an electronic component or a heat dissipator that is to be adhered is referred to as an object to be adhered.

First, the adhesive composition sheet of the present invention that has been formed on a peelable substrate is bonded to an object to be adhered, and then, after removal of the peelable substrate, the other object to be adhered is bonded to a surface of the opposite side of the adhesive composition sheet. As another aspect, a method of collectively bonding two objects to be adhered can also be performed by interposing the adhesive composition sheet of the present invention between the two objects to be adhered. Bonding is preferably performed, for example, with use of a hot press device at a temperature of room temperature or more and 150° C. or less and a pressure of 0.01 MPa or more and 10 MPa or less.

As another aspect, the adhesive composition sheet may be formed between objects to be adhered by a method of successively bonding the layer formation sheet A and the layer formation sheet B or applying the layer formation paste A and the layer formation paste B to an adhesion surface of an object to be adhered, to sequentially stack the layer A and the layer B, and bonding the other object to be adhered in the end. Alternatively, there is also a method of arranging the layer formation sheet A and the layer formation sheet B between objects to be adhered and then performing collective press bonding together with the objects to be adhered.

Next, a step of curing the adhesive composition sheet is performed. For example, there can be exemplified a method of curing the adhesive composition sheet by heating with use of an oven or a hot plate at a temperature of 100° C. or more and 200° C. or less and a period of 10 minutes or more and 5 hours or less. The heating can be performed in the air or in an inert air such as nitrogen. Alternatively, the adhesive composition sheet can be irradiated with ultraviolet light to proceed curing of the adhesive composition sheet. The irradiation with ultraviolet and heating may be used in combination. The curing of the adhesive composition sheet may be simultaneously performed with the heating in the step of bonding an object to be adhered to the adhesive composition sheet.

The cured product of the adhesive composition sheet preferably has a thickness-wise thermal diffusivity of preferably $0.8 \times 10^{-6}$ m$^2$/s or more, more preferably $1.2 \times 10^{-6}$ m$^2$/s or more, further preferably $1.5 \times 10^{-6}$ m$^2$/s or more. The cured product of the adhesive composition sheet having a thickness-wise thermal diffusivity of $0.8 \times 10^{-6}$ m$^2$/s or more can efficiently conduct the heat generated from a semiconductor chip exteriorly, suppressing a temperature rise of the semiconductor chip, to provide a semiconductor device that has no malfunction and is high in reliability.

The thickness-wise thermal diffusivity of the cured product of the adhesive composition sheet can be measured using a thermal diffusivity measuring apparatus (e.g., the laser flash thermal diffusivity measuring apparatus "LFA447" (manufactured by NETZSCH-Geratebau GmbH)) with a piece obtained by cutting out the cured product into a size of 1 cm×1 cm as a test piece.

EXAMPLES

Hereinafter, the present invention is described with reference to examples. The present invention, however, is not limited to these examples.

<Method of Measuring Thermal Diffusivity of Cured Product of Adhesive Composition Sheet>

With a piece obtained by cutting out the cured product of the resin composition sheet obtained in each of the examples and comparative examples into a size of 1 cm×1 cm as a test piece, the thickness-wise thermal diffusivity (m²/s) of the cured product was measured using the laser flash thermal diffusivity measuring apparatus "LFA447" (trade name, manufactured by NETZSCH-Geratebau GmbH).

<Method of Evaluating Withstand Voltage of Cured Product of Adhesive Composition Sheet>

The cured product of the resin composition sheet obtained in each of the examples and the comparative examples was evaluated for a withstand voltage, using the withstand voltage measuring apparatus "TOS5101" (trade name, manufactured by KIKUSUI ELECTRONICS CORPORATION). A direct current voltage was applied at a voltage rise rate of 0.5 kV/s along the sheet's film thickness direction at a temperature of 23° C. and a humidity of 50% RH, and a voltage at which a current of 0.2 mA or more flowed was defined as a withstand voltage. When the value of the electric current is kept at less than 0.2 mA even with a voltage raised up to 5 kV, the withstand voltage was determined as 5 kV.

The materials used in the examples and the comparative examples are as follows.

(a) Polyimide
Polyimide A

Under a stream of dry nitrogen, 4.82 g (0.0165 mol) of 1,3-bis(3-aminophenoxy)benzene (hereinafter, APB-N), 3.08 g (0.011 mol) of 3,3'-diamino-4,4'-dihydroxydiphenyl sulfone (hereinafter, ABPS), 4.97 g (0.02 mol) of 1,3-bis(3-aminopropyl)tetramethyldisiloxane (hereinafter, SiDA), and 0.47 g (0.005 mol) of aniline as a terminal blocking agent were dissolved in 130 g of N-methyl-2-pyrrolidone (hereinafter, NMP). To the resulting solution, 26.02 g (0.05 mol) of 2,2-bis{4-(3,4-dicarboxyphenoxy)phenyl}propane dianhydride (hereinafter, BSAA) was added together with 20 g of NMP and reacted at 25° C. for 1 hour, and then the solution was stirred at 50° C. for 4 hours. Thereafter, the solution was further stirred at 180° C. for 5 hours. After completion of the stirring, the solution was introduced into 3 L of water and filtered to collect a precipitate. The precipitate was washed with water three times and then dried by a vacuum drier at 80° C. for 20 hours. The resulting polymer solid was subjected to infrared spectroscopic measurement, and consequently absorption peaks of an imide structure attributed to a polyimide were detected around 1780 cm$^{-1}$ and around 1377 cm$^{-1}$. In this manner, a polyimide A that had a functional group capable of reacting with an epoxy group was obtained. When 6 g of tetrahydrofuran was added to 4 g of the polyimide A and stirred at 23° C., the polyimide was dissolved in tetrahydrofuran.

(b) Epoxy Compound
EPICLON (registered trade name) HP-4700 (trade name, basic skeleton: naphthalene, manufactured by DIC CORPORATION) jER (registered trade name) YL980 (trade name, basic skeleton: bisphenol A, manufactured by Mitsubishi Chemical Corporation)

(c) Curing Accelerator
CUREZOL (registered trade name) 2MAOK (imidazole, trade name, manufactured by SHIKOKU CHEMICALS CORPORATION) CUREZOL (registered trade name) 2P4MHZ (imidazole, trade name, manufactured by SHIKOKU CHEMICALS CORPORATION) SAN-AID (registered trade name) SI-200 (sulfonium salt, trade name, manufactured by SANSHIN CHEMICAL INDUSTRY CO., LTD.)

(d) Inorganic Particles
AlN Whisker A

The aluminum powder "TFG-A30P" (manufactured by Toyo Aluminium K. K.) was processed by pressing into a compact having a plate shape at a thickness of 0.5 mm. Next, this compact was raised to 600° C. in a vacuum atmosphere at 150 Pa and subsequently held for 30 minutes in a nitrogen atmosphere at 0.5 MPa with use of a high purity nitrogen gas for a reaction. The resulting product was a whisker shape and was confirmed to have an AlN crystal structure by measurement with the X-ray diffraction analyzer "D8 ADVANCE" (trade name, manufactured by Bruker Corporation). The AlN whisker had a length-wise dimension 100 times a dimension in a section perpendicular to the length-wise direction of the AlN whisker (hereinafter, referred to as a dimension ratio). The maximum particle size was 50 μm.

Carbon nanotube A (manufactured by THE HONJO CHEMICAL CORPORATION, abbreviated as CNT-A, dimension ratio: 400 times, maximum particle size: 10 μm)

MBN-010T (trade name, scale-shaped boron nitride particles, manufactured by Mitsui Chemicals, Inc., dimension ratio: 5 times, maximum particle size 1 μm)

XGP (trade name, scale-shaped boron nitride particles, manufactured by Denka Company Limited, dimension ratio: 10 times, maximum particle size: 40 μm)

FAN-f05 (trade name, spherical aluminum nitride particles, manufactured by FURUKAWA DENSHI CO., LTD., dimension ratio: 1 time, maximum particle size: 10 μm)

FAN-f30 (trade name, spherical aluminum nitride particles, manufactured by FURUKAWA DENSHI CO., LTD., dimension ratio: 1 time, maximum particle size: 40 μm)

AE9104-SXE (trade name, spherical aluminum oxide particles, manufactured by Admatechs Company Limited, dimension ratio: 1 time, maximum particle size: 20 μm)

DAW-03DC (trade name, spherical aluminum oxide particles, manufactured by Denka Company Limited, dimension ratio: 1 time, maximum particle size: 30 μm)

SUMICORANDOM (registered trade name) AA-1.5 (trade name, spherical aluminum oxide particles, manufactured by Sumitomo Chemical Company, Limited, dimension ratio: 1 time, maximum particle size: 2 μm)

(e) Solvent
Cyclohexane (manufactured by Wako Pure Chemical Industries, Ltd., abbreviated as CHN)

<Preparation of Layer Formation Pastes A-1 to A-15 and B-1 to B-21>

The components (a) to (e) described above were blended in the composition ratio of A-1 in Table 1 and subjected to a treatment of uniformly mixing the materials with a ball mill for 10 hours. In the ball mill, used were the zirconia balls "YTZ balls" (trade name, manufactured by Nikkato Corporation) having a diameter of 5 mm. After the ball mill treatment, the zirconia balls were removed with a sieve to give a layer formation paste A-1. In the same manner, the operation described above was performed in the composition ratios of A-2 to A-15 and B-1 to B-21 in Tables 1 to 5 to prepare layer formation pastes A-2 to A-15 and B-1 to B-21.

Example 1

Each of the layer formation pastes A-1 and B-1 was applied, with a bar coater, onto a peelable substrate, namely the separate film "SR-1" (trade name, manufactured by OHTSUKI INDUSTRIAL CO., LTD.) having a thickness of 75 μm and dried by a drying oven at 100° C. for 10 minutes to prepare a layer formation sheet A-1 and a layer formation sheet B-1. Here, the thickness of application was adjusted so that the layer formation sheets A-1 and B-1 had, as the dried adhesive composition sheets, thicknesses of 30 μm and 80 μm, respectively as shown in Table 6.

Next, the layer formation sheets A-1 and B-1 were bonded at a temperature of 80° C. with use of the vacuum laminator "VTM-200M" (manufactured by Takatori Corporation) to prepare an adhesive composition sheet having a two-layer structure. Next, the separate films were peeled from both surfaces of the adhesive composition sheet, and then the adhesive composition sheet was heated by an oven at 200° C. for 1 hour to be cured. The resulting cured product of the adhesive composition sheet was evaluated for thermal diffusivity and withstand voltage. Table 6 shows the results.

Examples 2 to 57, Comparative Examples 1 and 2

The same operation as in Example 1 was performed except that the type of the layer formation pastes and the film thickness of the layer formation sheets were changed as shown in Tables 6 to 14, and the evaluation was performed. Tables 6 to 14 show the results.

Example 58

Layer formation sheets A-1 and B-1 were prepared in the same manner as in Example 1. The thickness of application was adjusted so that the layer formation sheets A-1 and B-1 had thicknesses after drying of 15 μm and 80 μm, respectively. Two sheets were prepared as the layer formation sheets A-1.

Next, a layer formation sheet A-1 and the layer formation sheet B-1 were bonded at a temperature of 80° C. with use of the vacuum laminator "VTM-200M" (manufactured by Takatori Corporation) to prepare an adhesive composition sheet having a two-layer structure. Next, a separate film on the layer formation sheet B-1 of the adhesive composition sheet having a two-layer structure was peeled, and the other layer formation sheet A-1 was bonded onto the layer formation sheet B-1 at a temperature of 80° C. with use of the vacuum laminator to prepare an adhesive composition sheet having a three-layer structure. Separate films were peeled from both surfaces of the adhesive composition sheet, and then the adhesive composition sheet was heated by an oven at 200° C. for 1 hour to be cured. The resulting cured product of the adhesive composition sheet had a thermal diffusivity of $2.3 \times 10^{-3}$ m$^2$/s and a withstand voltage of 5 kV.

Comparative Example 3

The layer formation paste B-17 was applied, with a bar coater, onto a peelable substrate, namely the separate film "SR-1" (trade name, manufactured by OHTSUKI INDUSTRIAL CO., LTD.) having a thickness of 75 μm and dried by a drying oven at 100° C. for 10 minutes to prepare the layer formation sheet B-17. Here, the thickness of application was adjusted so that the layer formation sheet B-17 had, as the dried adhesive composition sheet, a thickness of 100 μm as shown in Table 14. Thus, the adhesive composition sheet having a single layer structure was prepared.

Next, the separate film was peeled from the adhesive composition sheet, and then the adhesive composition sheet was heated by an oven at 200° C. for 1 hour to be cured. The resulting cured product of the adhesive composition sheet was evaluated for thermal diffusivity and withstand voltage. Table 14 shows the results.

Comparative Examples 4 to 6

The same operation as in Comparative Example 5 was performed except that the type of the layer formation paste and the film thickness of the layer formation sheet were changed as shown in Table 14, and the evaluation was performed. Table 14 shows the results.

TABLE 1

| | | | A-1 | A-2 | A-3 | A-4 | A-5 |
|---|---|---|---|---|---|---|---|
| Composition of paste A | Polyimide | Material | Polyimide A | Polyimide A | Polyimide A | Polyimide A | Polyimide A |
| | | Amount (part by weight) | 15 | 15 | 15 | 15 | 15 |
| | Epoxy A1 | Material | EPICLON HP-4700 | EPICLON HP-4700 | EPICLON HP-4700 | EPICLON HP-4700 | EPICLON HP-4700 |
| | | Amount (part by weight) | 70 | 70 | 70 | 70 | 70 |
| | Epoxy A2 | Material | jERYL980 | jERYL980 | jERYL980 | jERYL980 | jERYL980 |
| | | Amount (part by weight) | 10 | 10 | 10 | 10 | 10 |
| | Curing accelerator | Material | CUREZOL 2MAOK | CUREZOL 2P4MHZ | SAN-AID SI-200 | CUREZOL 2MAOK | CUREZOL 2MAOK |
| | | Amount (part by weight) | 5 | 5 | 5 | 5 | 5 |
| | Inorganic particles A1 | Outline of material | AlN whisker A | AlN whisker A | AlN whisker A | CNT-A | FAN-f05 |
| | | Material Substance | AlN whisker | AlN whisker | AlN whisker | CNT | Aluminum nitride |
| | | Amount (part by weight) | 18 | 18 | 18 | 5 | 18 |
| | Solvent | Material | CHN | CHN | CHN | CHN | CHN |
| | | Amount (part by weight) | 140 | 140 | 140 | 180 | 120 |
| | Content rate of organic compound | | 94.8 vol % | 94.8 vol % | 94.8 vol % | 97.6 vol % | 94.8 vol % |

| | | | A-6 | A-7 | A-8 |
|---|---|---|---|---|---|
| Composition of paste A | Polyimide | Material | Polyimide A | Polyimide A | Polyimide A |
| | | Amount (part by weight) | 15 | 15 | 15 |
| | Epoxy A1 | Material | EPICLON HP-4700 | EPICLON HP-4700 | EPICLON HP-4700 |
| | | Amount (part by weight) | 70 | 70 | 70 |
| | Epoxy A2 | Material | jERYL980 | jERYL980 | jERYL980 |
| | | Amount (part by weight) | 10 | 10 | 10 |
| | Curing accelerator | Material | CUREZOL 2MAOK | CUREZOL 2MAOK | CUREZOL 2MAOK |
| | | Amount (part by weight) | 5 | 5 | 5 |

TABLE 1-continued

| | | | | | |
|---|---|---|---|---|---|
| | Inorganic particles A1 | Outline of material | Material Substance | MBN-010T Boron nitride | AlN whisker A AlN whisker | AlN whisker A AlN whisker |
| | | Amount (part by weight) | | 12 | 5 | 2 |
| | Solvent | Material | | CHN | CHN | CHN |
| | | Amount (part by weight) | | 130 | 120 | 120 |
| | Content rate of organic compound | | | 95.0 vol % | 98.5 vol % | 99.4 vol % |

TABLE 2

| | | | | A-9 | A-10 | A-11 | A-12 |
|---|---|---|---|---|---|---|---|
| Composition of paste A | Polyimide | Material | | Polyimide A | Polyimide A | — | — |
| | | Amount (part by weight) | | 15 | 15 | — | — |
| | Epoxy A1 | Material | | EPICLON HP-4700 | EPICLON HP-4700 | EPICLON HP-4700 | EPICLON HP-4700 |
| | | Amount (part by weight) | | 70 | 70 | 85 | 65 |
| | Epoxy A2 | Material | | jERYL980 | jERYL980 | jERYL980 | jERYL980 |
| | | Amount (part by weight) | | 10 | 10 | 10 | 30 |
| | Curing accelerator | Material | | CUREZOL 2MAOK | CUREZOL 2MAOK | CUREZOL 2MAOK | CUREZOL 2MAOK |
| | | Amount (part by weight) | | 5 | 5 | 5 | 5 |
| | Inorganic particles A1 | Outline of material | Material Substance | AlN whisker A AlN whisker | AlN whisker A AlN whisker | AlN whisker A AlN whisker | AlN whisker A AlN whisker |
| | | Amount (part by weight) | | 1 | 43 | 120 | 200 |
| | Solvent | Material | | CHN | CHN | CHN | CHN |
| | | Amount (part by weight) | | 120 | 170 | 210 | 260 |
| | Content rate of organic compound | | | 99.7 vol % | 88 vol % | 73 vol % | 62 vol % |

| | | | | A-13 | A-14 | A-15 |
|---|---|---|---|---|---|---|
| Composition of paste A | Polyimide | Material | | Polyimide A | — | Polyimide A |
| | | Amount (part by weight) | | 15 | — | 15 |
| | Epoxy A1 | Material | | EPICLON HP-4700 | EPICLON HP-4700 | EPICLON HP-4700 |
| | | Amount (part by weight) | | 70 | 55 | 70 |
| | Epoxy A2 | Material | | jERYL980 | jERYL980 | jERYL980 |
| | | Amount (part by weight) | | 10 | 40 | 10 |
| | Curing accelerator | Material | | CUREZOL 2MAOK | CUREZOL 2MAOK | CUREZOL 2MAOK |
| | | Amount (part by weight) | | 5 | 5 | 5 |
| | Inorganic particles A1 | Outline of material | Material Substance | AlN whisker A AlN whisker | AlN whisker A AlN whisker | — |
| | | Amount (part by weight) | | 0.2 | 300 | — |
| | Solvent | Material | | CHN | CHN | CHN |
| | | Amount (part by weight) | | 120 | 300 | 120 |
| | Content rate of organic compound | | | 99.94 vol % | 52 vol % | 100 vol % |

TABLE 3

| | | | | B-1 | B-2 | B-3 | B-4 |
|---|---|---|---|---|---|---|---|
| Composition of paste B | Polyimide | Material | | — | Polyimide A | — | — |
| | | Amount (part by weight) | | — | 15 | — | — |
| | Epoxy B1 | Material | | EPICLON HP-4700 | EPICLON HP-4700 | EPICLON HP-4700 | EPICLON HP-4700 |
| | | Amount (part by weight) | | 65 | 45 | 65 | 65 |
| | Epoxy B2 | Material | | jERYL980 | jERYL980 | jERYL980 | jERYL980 |
| | | Amount (part by weight) | | 30 | 35 | 30 | 30 |
| | Curing accelerator | Material | | CUREZOL 2MAOK | CUREZOL 2MAOK | CUREZOL 2P4MHZ | SAN-AID SI-200 |
| | | Amount (part by weight) | | 5 | 5 | 5 | 5 |
| | Inorganic particles B1 | Outline of material | Material Substance | AE9104-SXE Aluminum oxide | AE9104-SXE Aluminum oxide | AE9104-SXE Aluminum oxide | AE9104-SXE Aluminum oxide |
| | | Amount (part by weight) | | 1800 | 1800 | 1800 | 1800 |
| | Inorganic particles B2 | Outline of material | Material Substance | — | — | — | — |
| | | Amount (part by weight) | | — | — | — | — |
| | Solvent | Material | | CHN | CHN | CHN | CHN |
| | | Amount (part by weight) | | 400 | 400 | 500 | 400 |
| | Content rate of organic compound | | | 18 vol % | 18 vol % | 18 vol % | 18 vol % |

| | | | | B-5 | B-6 | B-7 |
|---|---|---|---|---|---|---|
| Composition of paste B | Polyimide | Material | | — | — | — |
| | | Amount (part by weight) | | — | — | — |

TABLE 3-continued

|  |  |  |  |  |  |
|---|---|---|---|---|---|
| Epoxy B1 | Material | EPICLON HP-4700 | EPICLON HP-4700 | EPICLON HP-4700 |
|  | Amount (part by weight) | 65 | 65 | 65 |
| Epoxy B2 | Material | jERYL980 | jERYL980 | jERYL980 |
|  | Amount (part by weight) | 30 | 30 | 30 |
| Curing accelerator | Material | CUREZOL 2MAOK | CUREZOL 2MAOK | CUREZOL 2MAOK |
|  | Amount (part by weight) | 5 | 5 | 5 |
| Inorganic particles B1 | Outline of material | Material | AE9104-SXE | AE9104-SXE | AE9104-SXE |
|  |  | Substance | Aluminum oxide | Aluminum oxide | Aluminum oxide |
|  | Amount (part by weight) | 2400 | 3000 | 3400 |
| Inorganic particles B2 | Outline of material | Material | AA-1.5 | AA-1.5 | AA-1.5 |
|  |  | Substance | Aluminum oxide | Aluminum oxide | Aluminum oxide |
|  | Amount (part by weight) | 300 | 500 | 600 |
| Solvent | Material | CHN | CHN | CHN |
|  | Amount (part by weight) | 600 | 800 | 900 |
| Content rate of organic compound |  | 13 vol % | 10 vol % | 9 vol % |

TABLE 4

|  |  |  | B-8 | B-9 | B-10 | B-11 |
|---|---|---|---|---|---|---|
| Composition of paste B | Polyimide | Material | — | — | — | — |
|  |  | Amount (part by weight) | — | — | — | — |
|  | Epoxy B1 | Material | EPICLON HP-4700 | EPICLON HP-4700 | EPICLON HP-4700 | EPICLON HP-4700 |
|  |  | Amount (part by weight) | 65 | 65 | 65 | 65 |
|  | Epoxy B2 | Material | jERYL980 | jERYL980 | jERYL980 | jERYL980 |
|  |  | Amount (part by weight) | 30 | 30 | 30 | 30 |
|  | Curing accelerator | Material | CUREZOL 2MAOK | CUREZOL 2MAOK | CUREZOL 2MAOK | CUREZOL 2MAOK |
|  |  | Amount (part by weight) | 5 | 5 | 5 | 5 |
|  | Inorganic particles B1 | Outline of material Material | DAW-03DC | DAW-03DC | FAN-f30 | FAN-f30 |
|  |  | Substance | Aluminum oxide | Aluminum oxide | Aluminum nitride | Aluminum nitride |
|  |  | Amount (part by weight) | 700 | 1100 | 540 | 900 |
|  | Inorganic particles B2 | Outline of material Material | — | — | — | — |
|  |  | Substance | — | — | — | — |
|  |  | Amount (part by weight) | — | — | — | — |
|  | Solvent | Material | CHN | CHN | CHN | CHN |
|  |  | Amount (part by weight) | 200 | 300 | 200 | 300 |
| Content rate of organic compound |  |  | 36 vol % | 26 vol % | 38 vol % | 27 vol % |

|  |  |  | B-12 | B-13 | B-14 |
|---|---|---|---|---|---|
| Composition of paste B | Polyimide | Material | — | — | — |
|  |  | Amount (part by weight) | — | — | — |
|  | Epoxy B1 | Material | EPICLON HP-4700 | EPICLON HP-4700 | EPICLON HP-4700 |
|  |  | Amount (part by weight) | 65 | 65 | 65 |
|  | Epoxy B2 | Material | jERYL980 | jERYL980 | jERYL980 |
|  |  | Amount (part by weight) | 30 | 30 | 30 |
|  | Curing accelerator | Material | CUREZOL 2MAOK | CUREZOL 2MAOK | CUREZOL 2MAOK |
|  |  | Amount (part by weight) | 5 | 5 | 5 |
|  | Inorganic particles B1 | Outline of material Material | FAN-f30 | FAN-f30 | FAN-f30 |
|  |  | Substance | Aluminum nitride | Aluminum nitride | Aluminum nitride |
|  |  | Amount (part by weight) | 1100 | 1600 | 3000 |
|  | Inorganic particles B2 | Outline of material Material | MBN-010T | MBN-010T | MBN-010T |
|  |  | Substance | Boron nitride | Boron nitride | Boron nitride |
|  |  | Amount (part by weight) | 200 | 300 | 500 |
|  | Solvent | Material | CHN | CHN | CHN |
|  |  | Amount (part by weight) | 500 | 700 | 1000 |
| Content rate of organic compound |  |  | 19 vol % | 14 vol % | 8 vol % |

TABLE 5

|  |  |  | B-15 | B-16 | B-17 | B-18 |
|---|---|---|---|---|---|---|
| Composition of paste B | Polyimide | Material | — | — | — | — |
|  |  | Amount (part by weight) | — | — | — | — |
|  | Epoxy B1 | Material | EPICLON HP-4700 | EPICLON HP-4700 | EPICLON HP-4700 | EPICLON HP-4700 |
|  |  | Amount (part by weight) | 65 | 65 | 85 | 65 |

TABLE 5-continued

|  |  |  |  |  |  |  |  |
|---|---|---|---|---|---|---|---|
|  | Epoxy B2 | Material |  | jERYL980 | jERYL980 | jERYL980 | jERYL980 |
|  |  | Amount (part by weight) |  | 30 | 30 | 10 | 30 |
|  | Curing accelerator | Material |  | CUREZOL 2MAOK | CUREZOL 2MAOK | CUREZOL 2MAOK | CUREZOL 2MAOK |
|  |  | Amount (part by weight) |  | 5 | 5 | 5 | 5 |
|  | Inorganic particles B1 | Outline of material | Material Substance | FAN-f30 Aluminum nitride | AE9104-SXE Aluminum oxide | AlN whisker A AlN whisker | AE9104-SXE Aluminum oxide |
|  |  | Amount (part by weight) |  | 300 | 8500 | 120 | 500 |
|  | Inorganic particles B2 | Outline of material | Material Substance | MBN-010T Boron nitride | — — | — — | AA-1.5 Aluminum oxide |
|  |  | Amount (part by weight) |  | 70 | — | — | 160 |
|  | Solvent | Material |  | CHN | CHN | CHN | CHN |
|  |  | Amount (part by weight) |  | 200 | 2400 | 210 | 150 |
|  | Content rate of organic compound |  |  | 45 vol % | 4 vol % | 73 vol % | 37 vol % |

|  |  |  |  | B-19 | B-20 | B-21 |
|---|---|---|---|---|---|---|
| Composition of paste B | Polyimide | Material |  | — | — | — |
|  |  | Amount (part by weight) |  | — | — | — |
|  | Epoxy B1 | Material |  | EPICLON HP-4700 | EPICLON HP-4700 | EPICLON HP-4700 |
|  |  | Amount (part by weight) |  | 65 | 65 | 65 |
|  | Epoxy B2 | Material |  | jERYL980 | jERYL980 | jERYL980 |
|  |  | Amount (part by weight) |  | 30 | 30 | 30 |
|  | Curing accelerator | Material |  | CUREZOL 2MAOK | CUREZOL 2MAOK | CUREZOL 2MAOK |
|  |  | Amount (part by weight) |  | 5 | 5 | 5 |
|  | Inorganic particles B1 | Outline of material | Material Substance | AE9104-SXE Aluminum oxide | FAN-f30 Aluminum nitride | FAN-f30 Aluminum nitride |
|  |  | Amount (part by weight) |  | 620 | 1100 | 1100 |
|  | Inorganic particles B2 | Outline of material | Material Substance | AlN whisker A AlN whisker | AlN whisker A AlN whisker | XGP Boron nitride |
|  |  | Amount (part by weight) |  | 40 | 100 | 100 |
|  | Solvent | Material |  | CHN | CHN | CHN |
|  |  | Amount (part by weight) |  | 180 | 500 | 400 |
|  | Content rate of organic compound |  |  | 37 vol % | 22 vol % | 21 vol % |

TABLE 6

|  |  |  | Example 1 | Example 2 | Example 3 | Example 4 | Example 5 | Example 6 | Example 7 |
|---|---|---|---|---|---|---|---|---|---|
| Composition | Sheet A | Paste A | A-1 | A-1 | A-2 | A-3 | A-4 | A-7 | A-8 |
|  |  | Film thickness | 30 μm | 30 μm | 30 μm | 30 μm | 30 μm | 30 μm | 30 μm |
|  | Sheet B | Paste B | B-1 | B-2 | B-3 | B-4 | B-1 | B-1 | B-1 |
|  |  | Film thickness | 80 μm | 80 μm | 80 μm | 80 μm | 80 μm | 80 μm | 80 μm |
|  | Content rate of inorganic particles |  | 61 vol % | 61 vol % | 61 vol % | 61 vol % | 61 vol % | 60 vol % | 60 vol % |
|  | Content rate of organic compound |  | 39 vol % | 39 vol % | 39 vol % | 39 vol % | 39 vol % | 40 vol % | 40 vol % |
| Thermal diffusivity ($10^{-6}$ m$^2$/s) |  |  | 2.2 | 2.1 | 2.1 | 2.5 | 3.1 | 2.1 | 1.7 |
| Withstand voltage (kV) |  |  | 5 | 5 | 5 | 5 | 5 | 5 | 5 |

TABLE 7

|  |  |  | Example 8 | Example 9 | Example 10 | Example 11 | Example 12 | Example 13 | Example 14 |
|---|---|---|---|---|---|---|---|---|---|
| Composition | Sheet A | Paste A | A-9 | A-10 | A-11 | A-12 | A-1 | A-4 | A-7 |
|  |  | Film thickness | 30 μm | 30 μm | 30 μm | 30 μm | 30 μm | 30 μm | 30 μm |
|  | Sheet B | Paste B | B-1 | B-1 | B-1 | B-1 | B-5 | B-5 | B-5 |
|  |  | Film thickness | 80 μm | 80 μm | 80 μm | 80 μm | 80 μm | 80 μm | 80 μm |
|  | Content rate of inorganic particles |  | 60 vol % | 63 vol % | 67 vol % | 70 vol % | 65 vol % | 64 vol % | 64 vol % |
|  | Content rate of organic compound |  | 40 vol % | 37 vol % | 33 vol % | 30 vol % | 35 vol % | 36 vol % | 36 vol % |
| Thermal diffusivity ($10^{-6}$ m$^2$/s) |  |  | 1.5 | 2.3 | 2.3 | 1.4 | 2.3 | 3.2 | 2.2 |
| Withstand voltage (kV) |  |  | 5 | 5 | 5 | 5 | 5 | 5 | 5 |

TABLE 8

|  |  |  | Example 15 | Example 16 | Example 17 | Example 18 | Example 19 | Example 20 | Example 21 |
|---|---|---|---|---|---|---|---|---|---|
| Composition | Sheet A | Paste A | A-10 | A-11 | A-1 | A-7 | A-10 | A-1 | A-7 |
|  |  | Film thickness | 30 μm | 30 μm | 30 μm | 30 μm | 30 μm | 30 μm | 30 μm |
|  | Sheet B | Paste 3 | B-5 | B-5 | B-6 | B-6 | B-6 | B-7 | B-7 |
|  |  | Film thickness | 80 μm | 80 μm | 80 μm | 80 μm | 80 μm | 80 μm | 80 μm |
|  | Content rate of inorganic particles | | 67 vol % | 71 vol % | 67 vol % | 65 vol % | 69 vol % | 68 vol % | 67 vol % |
|  | Content rate of organic compound | | 33 vol % | 29 vol % | 33 vol % | 34 vol % | 31 vol % | 32 vol % | 33 vol % |
| Thermal diffusivity ($10^{-6}$ m$^2$/s) | | | 2.3 | 2.3 | 2.1 | 2.1 | 2.1 | 1.4 | 1.3 |
| Withstand voltage (kV) | | | 5 | 5 | 5 | 5 | 5 | 5 | 5 |

TABLE 9

|  |  |  | Example 22 | Example 23 | Example 24 | Example 25 | Example 26 | Example 27 | Example 28 |
|---|---|---|---|---|---|---|---|---|---|
| Composition | Sheet A | Paste A | A-10 | A-1 | A-1 | A-1 | A-1 | A-1 | A-1 |
|  |  | Film thickness | 30 μm | 30 μm | 30 μm | 30 μm | 30 μm | 30 μm | 30 μm |
|  | Sheet B | Paste B | B-7 | B-8 | B-9 | B-10 | B-11 | B-12 | B-13 |
|  |  | Film thickness | 80 μm | 80 μm | 80 μm | 80 μm | 80 μm | 80 μm | 80 μm |
|  | Content rate of inorganic particles | | 69 vol % | 48 vol % | 55 vol % | 47 vol % | 55 vol % | 60 vol % | 64 vol % |
|  | Content rate of organic compound | | 31 vol % | 52 vol % | 45 vol % | 53 vol % | 45 vol % | 40 vol % | 36 vol % |
| Thermal diffusivity ($10^{-6}$ m$^2$/s) | | | 1.4 | 1.3 | 2.0 | 1.4 | 2.5 | 2.9 | 2.9 |
| Withstand voltage (kV) | | | 5 | 5 | 5 | 5 | 5 | 5 | 5 |

TABLE 10

|  |  |  | Example 29 | Example 30 | Example 31 | Example 32 | Example 33 | Example 34 | Example 35 |
|---|---|---|---|---|---|---|---|---|---|
| Composition | Sheet A | Paste A | A-7 | A-10 | A-11 | A-1 | A-1 | A-10 | A-11 |
|  |  | Film thickness | 30 μm | 30 μm | 30 μm | 30 μm | 40 μm | 40 μm | 40 μm |
|  | Sheet B | Paste B | B-13 | B-13 | B-13 | B-14 | B-1 | B-1 | B-1 |
|  |  | Film thickness | 80 μm | 80 μm | 80 μm | 80 μm | 60 μm | 60 μm | 60 μm |
|  | Content rate of inorganic particles | | 63 vol % | 66 vol % | 70 vol % | 68 vol % | 51 vol % | 54 vol % | 60 vol % |
|  | Content rate of organic compound | | 37 vol % | 34 vol % | 30 vol % | 32 vol % | 49 vol % | 46 vol % | 40 vol % |
| Thermal diffusivity ($10^{-6}$ m$^2$/s) | | | 2.8 | 3.0 | 2.8 | 1.9 | 2.0 | 2.1 | 2.1 |
| Withstand voltage (kV) | | | 5 | 5 | 5 | 5 | 5 | 5 | 5 |

TABLE 11

|  |  |  | Example 36 | Example 37 | Example 38 | Example 39 | Example 40 | Example 41 | Example 42 |
|---|---|---|---|---|---|---|---|---|---|
| Composition | Sheet A | Paste A | A-12 | A-1 | A-10 | A-1 | A-1 | A-10 | A-11 |
|  |  | Film thickness | 40 μm | 40 μm | 40 μm | 40 μm | 20 μm | 20 μm | 20 μm |
|  | Sheet B | Paste B | B-1 | B-6 | B-6 | B-11 | B-1 | B-1 | B-1 |
|  |  | Film thickness | 60 μm | 60 μm | 60 μm | 60 μm | 100 μm | 100 μm | 100 μm |
|  | Content rate of inorganic particles | | 64 vol % | 56 vol % | 59 vol % | 46 vol % | 69 vol % | 70 vol % | 73 vol % |
|  | Content rate of organic compound | | 36 vol % | 44 vol % | 41 vol % | 54 vol % | 31 vol % | 30 vol % | 27 vol % |
| Thermal diffusivity ($10^{-6}$ m$^2$/s) | | | 1.3 | 1.9 | 2.0 | 1.4 | 2.1 | 2.3 | 2.2 |
| Withstand voltage (kv) | | | 5 | 5 | 5 | 5 | 5 | 5 | 5 |

TABLE 12

|  |  |  | Example 43 | Example 44 | Example 45 | Example 46 | Example 47 | Example 48 | Example 51 |
|---|---|---|---|---|---|---|---|---|---|
| Composition | Sheet A | Paste A | A-1 | A-10 | A-10 | A-1 | A-13 | A-14 | A-6 |
|  |  | Film thickness | 20 μm | 20 μm | 40 μm | 40 μm | 30 μm | 30 μm | 30 μm |
|  | Sheet B | Paste B | B-6 | B-6 | B-15 | B-16 | B-1 | B-1 | B-1 |
|  |  | Film thickness | 100 μm | 100 μm | 60 μm | 60 μm | 80 μm | 80 μm | 80 μm |
|  | Content rate of inorganic particles | | 76 vol % | 77 vol % | 38 vol % | 59 vol % | 60 vol % | 73 vol % | 61 vol % |
|  | Content rate of organic compound | | 24 vol % | 23 vol % | 62 vol % | 41 vol % | 40 vol % | 27 vol % | 39 vol % |
| Thermal diffusivity ($10^{-6}$ m$^2$/s) | | | 1.2 | 1.2 | 1.0 | 1.0 | 1.0 | 1.0 | 0.6 |
| Withstand voltage (kV) | | | 5 | 5 | 5 | 5 | 5 | 5 | 5 |

TABLE 13

| | | | Example 52 | Example 53 | Example 54 | Example 55 | Example 56 | Example 57 |
|---|---|---|---|---|---|---|---|---|
| Composition | Sheet A | Paste A | A-6 | A-15 | A-5 | A-15 | A-1 | A-15 |
| | | Film thickness | 30 μm | 30 μm | 30 μm | 30 μm | 30 μm | 30 μm |
| | Sheet B | Paste B | B-13 | B-13 | B-13 | B-20 | B-20 | B-21 |
| | | Film thickness | 80 μm | 80 μm | 80 μm | 80 μm | 80 μm | 80 μm |
| | | Content rate of inorganic particles | 64 vol % | 63 vol % | 64 vol % | 57 vol % | 58 vol % | 57 vol % |
| | | Content rate of organic compound | 36 vol % | 37 vol % | 36 vol % | 43 vol % | 42 vol % | 43 vol % |
| Thermal diffusivity ($10^{-6}$ m$^2$/s) | | | 0.8 | 0.7 | 0.7 | 2.8 | 3.2 | 1.0 |
| Withstand voltage (kV) | | | 5 | 5 | 5 | 5 | 5 | 5 |

TABLE 14

| | | | Comparative Example 1 | Comparative Example 2 | Comparative Example 3 | Comparative Example 4 | Comparative Example 5 | Comparative Example 6 |
|---|---|---|---|---|---|---|---|---|
| Composition | Sheet A | Paste A | A-15 | A-5 | — | — | — | — |
| | | Film thickness | 30 μm | 30 μm | — | — | — | — |
| | Sheet B | Paste B | B-1 | B-1 | B-17 | B-18 | B-19 | B-20 |
| | | Film thickness | 80 μm | 80 μm | 100 μm | 100 μm | 100 μm | 100 μm |
| | | Content rate of inorganic particles | 60 vol % | 61 vol % | 27 vol % | 63 vol % | 63 vol % | 78 vol % |
| | | Content rate of organic compound | 40 vol % | 39 vol % | 73 vol % | 37 vol % | 37 vol % | 22 vol % |
| Thermal diffusivity ($10^{-6}$ m$^2$/s) | | | 0.5 | 0.5 | 0.3 | 0.5 | 0.5 | 0.2 |
| Withstand voltage (kV) | | | 5 | 5 | 2 | 0.5 | 0.4 | 0.1 |

INDUSTRIAL APPLICABILITY

An adhesive composition sheet of the present invention can be suitably used as a high thermal conductive adhesive composition sheet for a semiconductor device that can be used to adhere an electronic component, such as a semiconductor chip, used in, for example, a vehicle, a personal computer, and a mobile phone to, for example, a wiring substrate or a heat sink, and to adhere electronic components to each other.

The invention claimed is:

1. An adhesive composition sheet for a semiconductor device, wherein
the adhesive composition sheet comprises a structure in which at least a layer A that contains an organic compound and a layer B that contains an organic compound and inorganic particles are laminated,
the layer A has a content rate of vol % of the organic compound larger than a content rate of vol % of the organic compound in the layer B,
the layer A and/or the layer B contains anisotropically shaped thermal conductive inorganic particles, and
the anisotropically shaped thermal conductive inorganic particles are at least one type of inorganic particles selected from a carbon nanotube, a boron nitride nanotube, scale-shaped boron nitride, an aluminum nitride whisker, a silicon carbide whisker, and an aluminum oxide whisker.

2. The adhesive composition sheet according to claim 1, wherein the anisotropically shaped thermal conductive inorganic particles have a length in longitudinal direction 4 times or more and 500 times or less as long as a length in a section perpendicular to a longitudinal direction.

3. The adhesive composition sheet according to claim 1, wherein the layer A has a content rate of the organic compound of 60 vol % or more and 100 vol % or less and the layer B has a content rate of the organic compound of 1 vol % or more and 40 vol % or less.

4. The adhesive composition sheet according to claim 1, wherein the layer A contains the anisotropically shaped thermal conductive inorganic particles.

5. The adhesive composition sheet according to claim 4, wherein the layer A contains the anisotropically shaped thermal conductive inorganic particles, has a content rate of the inorganic particles of 0.2 vol % or more and 40 vol % or less, and has a content rate of the organic compound of 60 vol % or more and 99.8 vol % or less.

6. The adhesive composition sheet according to claim 1, wherein the layer B contains spherical thermal conductive inorganic particles.

7. The adhesive composition sheet according to claim 6, wherein the layer B contains the spherical thermal conductive inorganic particles, has a content rate of the inorganic particles of 60 vol % or more and 99 vol % or less, and has a content rate of the organic compound of 1 vol % or more and 40 vol % or less.

8. The adhesive composition sheet according to claim 1, comprising a three-or-more layer structure in which the layer A and the layer B are laminated alternately.

9. A semiconductor device comprising a cured product of the adhesive composition sheet according to claim 1.

10. A method of producing a semiconductor device, the method comprising:
bonding an electronic component to a heat dissipator or bonding electronic components to each other with an adhesive composition sheet interposed between the electronic component and the heat dissipator or between the electronic components; and
curing the adhesive composition sheet,
wherein the adhesive composition sheet comprises a structure in which at least a layer A that contains an organic compound and a layer B that contains an organic compound and inorganic particles are laminated,
the layer A has a content rate of vol % of the organic compound larger than a content rate of vol % of the organic compound in the layer B,
the layer A and/or the layer B contains anisotropically shaped thermal conductive inorganic particles, and
the anisotropically shaped thermal conductive inorganic particles are at least one type of inorganic particles selected from a carbon nanotube, a boron nitride nanotube, scale-shaped boron nitride, an aluminum nitride whisker, a silicon carbide whisker, and an aluminum oxide whisker.

* * * * *